United States Patent
Sasaki et al.

(10) Patent No.: US 7,244,370 B2
(45) Date of Patent: Jul. 17, 2007

(54) METHOD FOR PRODUCING CIRCUIT SUBSTRATE

(75) Inventors: Keiichi Sasaki, Kanagawa (JP); Masato Kamiichi, Kanagawa (JP); Yukihiro Hayakawa, Kanagawa (JP); Ershad Ali Chowdhury, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 459 days.

(21) Appl. No.: 10/910,271

(22) Filed: Aug. 4, 2004

(65) Prior Publication Data
US 2005/0031996 A1 Feb. 10, 2005

(30) Foreign Application Priority Data
Aug. 5, 2003 (JP) ............................. 2003-286576
Sep. 5, 2003 (JP) ............................. 2003-313871

(51) Int. Cl.
*G01D 15/00* (2006.01)
*G11B 5/127* (2006.01)
*H01B 13/00* (2006.01)

(52) U.S. Cl. ......................................... 216/27; 216/16

(58) Field of Classification Search ................. 216/13, 216/16, 41, 27, 102; 438/21; 29/890.1
See application file for complete search history.

(56) References Cited

U.S. PATENT DOCUMENTS

| | | | | |
|---|---|---|---|---|
| 4,455,364 A | * | 6/1984 | Sasa | 430/299 |
| 5,298,112 A | * | 3/1994 | Hayasaka et al. | 216/67 |
| 5,376,231 A | | 12/1994 | Matsumoto et al. | 156/656 |
| 2003/0076384 A1 | | 4/2003 | Tamura et al. | 347/62 |
| 2004/0007767 A1 | | 1/2004 | Hayakawa et al. | 257/659 |

\* cited by examiner

*Primary Examiner*—Parviz Hassanzadeh
*Assistant Examiner*—Roberts Culbert
(74) *Attorney, Agent, or Firm*—Fitzpatrick, Cella, Harper & Scinto

(57) ABSTRACT

In order to provide a circuit substrate with a satisfactory step coverage by the protective layer and the anti-cavitation film in an edge portion of wirings and a liquid discharge head utilizing such circuit substrate, the invention provides a method for producing a circuit substrate provided, on an insulating surface of a substrate, with a plurality of elements each including a resistive layer and a pair of electrodes formed with a predetermined spacing on said resistive layer, including a step of forming an aluminum electrode wiring layer on the resistive layer, a step of isolating the electrode wiring layer by dry etching into each element, and a step of forming the electrode wiring into a tapered cross section with an etching solution containing phosphoric acid, nitric acid and a chelating agent capable of forming a complex with the wiring metal.

12 Claims, 11 Drawing Sheets

METHOD FOR PRODUCING CIRCUIT SUBSTRATE

BACKGROUND OF THE INVENTION

1. Field of the Invention

The present invention relates to a circuit substrate provided with a plurality of heat generating elements having heat generating resistors, and a producing method therefor. In particular, it relates to a circuit substrate for a liquid discharge apparatus, provided in a liquid discharge head such as an ink jet head for converting an electrical energy into thermal energy by a heat generating resistor and utilizing such thermal energy for discharging liquid, and a producing method therefor.

2. Related Background Art

In the following, there will be explained a prior method for producing a circuit substrate, taking an ink jet head as an example.

An ink jet recording apparatus discharges ink as a minute liquid droplet from a discharge port onto a recording material, thereby recording a high definition image. In this operation, the ink jet recording apparatus converts an electrical energy by a heat generating resistive member into thermal energy, and generates a bubble by such thermal energy. By an action force of the bubble, a liquid droplet is discharged from a discharge port at a front end of a liquid discharge head. The liquid droplet discharged from the discharge port is deposited on a recording material to record an image. In general, such liquid discharge head includes a circuit substrate provided with a plurality of heat generating resistive members for converting electrical energy into thermal energy.

The heat generating resistive member is an electrothermal converting member for converting electrical energy into thermal energy. The heat generating resistive member is protected by an upper protective layer from contact with the ink.

More specifically, a resistive material layer and an electrode material layer are formed on an insulating surface, a part of the electrode material layer is removed to form a pair of electrodes, between which the resistive material layer constitutes a heat generating portion. Then there are formed a protective layer for protecting these layers from the ink, and an anticavitation layer for protecting the protective layer from a chemical or physical damage resulting from heat generation.

In such configuration, there may result an unsatisfactory step coverage in edge portions of the electrodes for defining the heat generating portion. Such situation is schematically illustrated in FIG. 7. An illustrated circuit substrate has an oxide layer 61, on which a resistive layer 62 such as of TaSiN is formed. The oxide layer 61 is formed by oxidizing a surface of a Si substrate, and FIG. 7 illustrates only the oxide layer on the surface. On the resistive layer 62, an Al wiring 63 is provided but is partially absent on the resistive layer 62, and the resistive layer constitutes a heat generating portion 64 in a portion where the wiring 63 is absent. On the resistive layer 62 and the wiring 63, there is provided a protective layer 65 formed, for example, by P—SiN for protecting these layers from the ink, and, in the heat generating portion 64 of the resistive layer, an anti-cavitation layer 66 formed by Ta is provided on the protective layer 65 for protecting the protective layer 65 from a chemical or physical damage resulting from heat generation. An edge portion of the wiring 63 is illustrated with a substantially vertical structure.

The circuit substrate for a liquid discharge apparatus is provided, at a high density, with a plurality of such heat generating elements including heat generating resistive members as explained above, thereby enabling a high definition image recording. Each heat generating element is serially connected with a power transistor (not shown) for on-off controlling a current in the heat generating resistive member. Also discharge ports are formed on the circuit substrate to constitute a liquid discharge apparatus.

In FIG. 7, in portions indicated by arrows, P—SiN and Ta are unable to cover the wiring 63 with satisfactory step coverage.

In order to resolve such difficulty, there has been developed, as described in U.S. Pat. No. 5,376,231, a method of giving a tapered shape to the edge portions of a pair of electrodes of a heat generating element. Such method allows to improve the coverage of the protective layer and the anti-cavitation layer also in the edge portions of the paired electrodes of the heat generating element. In the following, there will be explained a method of producing a circuit substrate, including a method of forming tapered portions in the paired electrodes of the heat generating element.

FIG. 6 is a flow chart showing a process flow for preparing a prior heat generating resistive member, and FIG. 5A is a cross-sectional view of a heat generating resistive portion after the preparation. At first a Si wafer is used as a substrate, bearing a $SiO_2$ oxide layer 41 of a thickness of several micrometers by a thermal oxidation process. A resistive material layer of TaSiN or the like of a thickness of about 50 nm is formed by sputtering thereon. Thereafter, for example, an Al film is formed with a film thickness of about 200 nm to form a wiring material layer. Then a resist layer (1) is formed and patterned, and the Al and the resistive material layer are dry etched, for example, by RIE to achieve element isolation, thereby forming a wiring layer 43 and a resistive layer 42. After the resist layer (I) is eliminated by $O_2$ ashing, a resist layer (II) is formed and patterned, and the Al is eliminated by wet etching from a portion of the resistive layer to constitute a heat generating portion 44. In this operation, as the wet etching solution, there is employed an organic alkali etching solution containing tetramethyl ammonium hydroxide (hereinafter represented as TMAH) as a principal component or an acid etching solution containing phosphoric acid as a principal component, whereby an end portion of the resist layer (II) is retracted by etching during etching of Al, thereby forming a tapered shape in the edge portions of a pair of electrodes to be formed. Then a SiN protective layer 45 of a thickness of about 300 nm is formed by plasma CVD, and a Ta film 46 is formed by sputtering. An unnecessary portion of the Ta film 46 is removed by dry etching to obtain a circuit substrate.

However, with the recent progress in the printing technology toward a higher definition, an ink discharge amount per discharge has decreased from several tens of picoliters to several picoliters. Also there is a strong demand for an even higher printing speed, and a longer dimension of the substrae is desired for reducing the number of reciprocating motions of the liquid discharge head. For these reasons, the number of heat generating elements per circuit substrate is increasing from several hundreds to several thousands. Under such situation, even the aforementioned method of forming a pair of tapered electrodes shows a slight fluctuation in such tapered shape, thus deteriorating the coverage of the protective layer and the anti-cavitation film in a part of the heat generating elements.

Therefore, an object of the present invention is to provide a circuit substrate for a liquid discharge head, showing a satisfactory coverage of the protective layer and the anti-cavitation film on the heat generating elements and providing an excellent durability, and a producing method therefor.

SUMMARY OF THE INVENTION

According to the investigation of the present inventors, it is found that one of the causes for slight fluctuation in the tapered shape, which is a drawback in the prior technology, is an. Al void formed by an Al—Cu battery effect in the tapered etching for eliminating the resist layer (II).

Such Al void, as illustrated in an Al void portion 49 by the battery effect in FIG. 5B, deteriorates the step coverage of the protective film in the tapered portion, thus resulting in a breakage of wiring in the circuit substrate. In order to resolve this drawback, an improvement in the etching method is made in the present invention in order to avoid the Al void at the tapered etching.

More specifically, the present invention provides a method for producing a circuit substrate provided, on an insulating surface of a substrate, with a plurality of elements each including a resistive layer and electrodes constituted of a conductive material containing aluminum, and positioned with a predetermined spacing on the resistive layer, the method including:
  (a) a step of laminating, on the insulating surface of the substrate, a resistive material layer for forming the resistive layer, and an electrode material layer constituted of a conductive material containing aluminum for forming the electrodes, in succession in this order;
  (b) a step of forming, on the electrode material layer, a resist layer (I) having a pattern for isolating the resistive material layer and the electrode material layer into each element;
  (c) a step of patterning the resistive material layer and the electrode material layer by dry etching based on the pattern of the resist layer (I) thereby forming a laminate structure in which the electrode material layer is laminated on the resistive material layer;
  (d) a step of eliminating the resist layer (I) on the laminate structure;
  (e) a step of forming a resist layer (II) having a pattern for forming the spacing; and
  (f) a step of patterning the electrode material layer by wet etching with an etching solution containing an acid or an organic alkali having an etching ability and a chelating agent capable of forming a complex with the conductive material, based on the pattern of said resist layer (II), thereby forming the spacing to complete the element.

The aforementioned method of the invention for producing the circuit substrate allows to obtain a circuit substrate for a liquid discharge head, having satisfactory coverage of the protective layer and the anti-cavitation layer on the heat generating element and excellent in durability.

The aforementioned method for producing the circuit substrate is suitable in case the electrode material layer contains aluminum as a principal component, and also in case copper is added to the electrode material layer. In particular, it is suitable in case the chelating agent added in the etching solution is a chelating agent capable of forming a complex on the surface of the electrode material layer, and particularly, in case the solution is alkaline, it is benzotriazole (BTA) or phosphoric amine, or, in case the solution is acidic, it is at least one selected from citric acid, oxalic acid and ethylenediaminetetraacetic acid (EDTA). In case the chelating agent is citric acid, it is particularly advantageous to have a step (h) of immersion in an aqueous solution of citric acid after the wet etching step (f) and before a rinsing step (g).

It is also particularly advantageous to have a step of eliminating an unnecessary portion by ashing, immediately after the aforementioned dry etching.

The present invention has been found on an Al—Cu alloy, but is not limited to such case and is also applicable to a case where the wiring contains Al and also a substance different from Al in ionization tendency and causing a battery effect with Al.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 5A and 5B are schematic cross-sectional views showing vicinity of a heat generating element in the circuit substrate, wherein FIG. 5A is a cross-sectional view of a circuit substrate with a satisfactory coverage of a protective film and an anti-cavitation film, and FIG. 5B is a cross-sectional view of a circuit substrate in which an overhang structure is formed on the wiring surface with an unsatisfactory coverage of the protective film and the anti-cavitation film;

DESCRIPTION OF THE PREFERRED EMBODIMENTS

Figure 1:
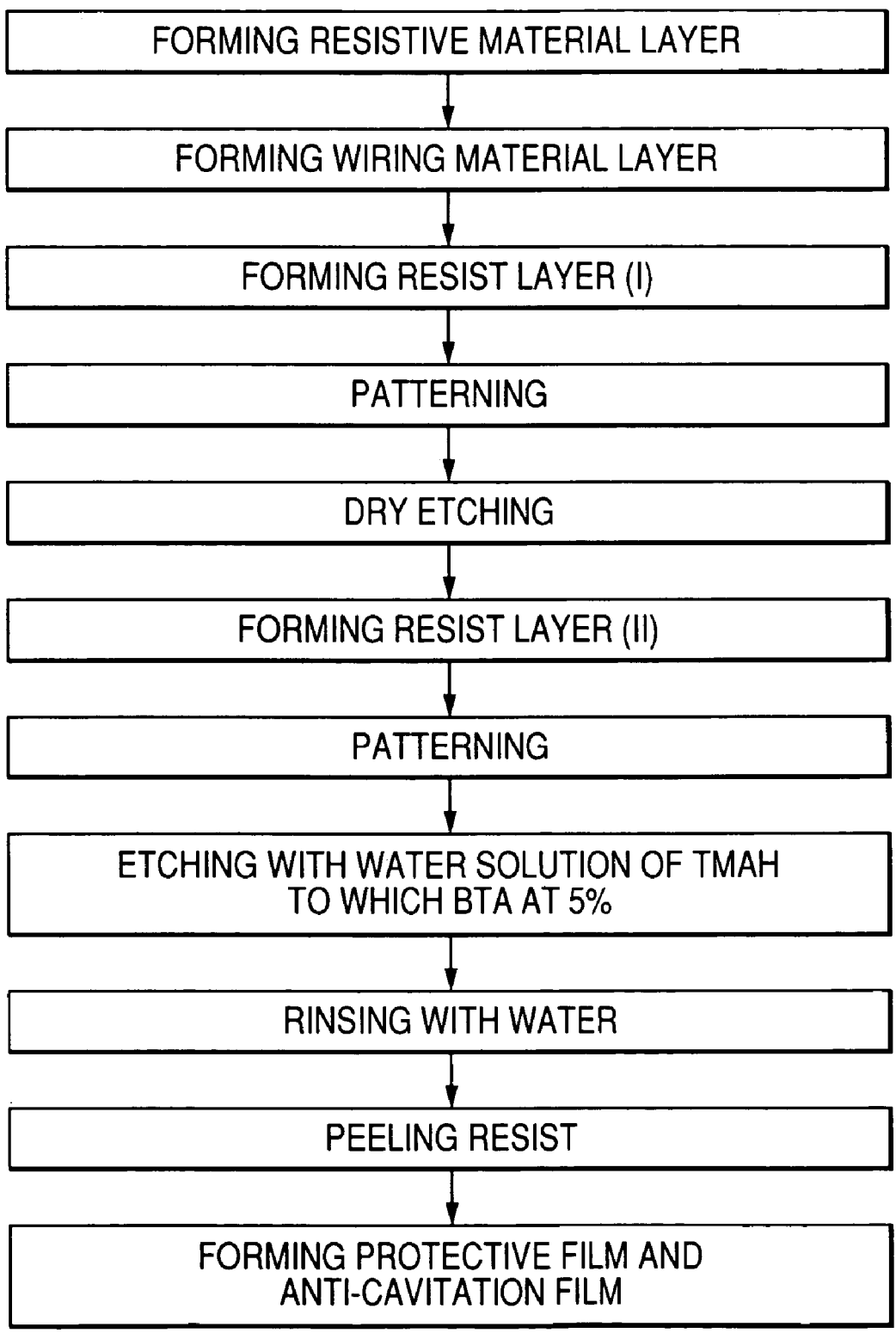
FIG. 1 is a flow chart showing a process for producing a circuit substrate in an example 1 embodying the present invention.
Figure 2A:
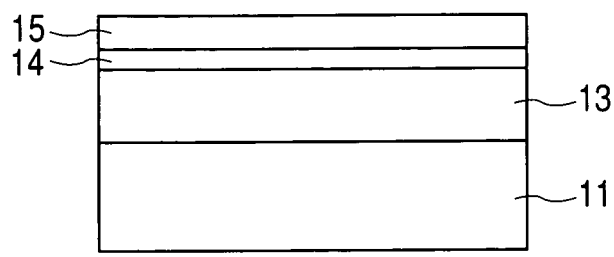
FIGS. 2A, 2B, 2C, 2D, and 2E are cross-sectional views showing a process for producing a circuit substrate in an embodiment of the present invention.
Figure 2B:
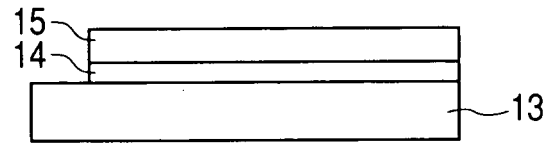
Figure 2C:
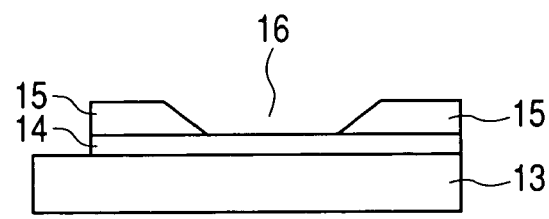
Figure 2D:
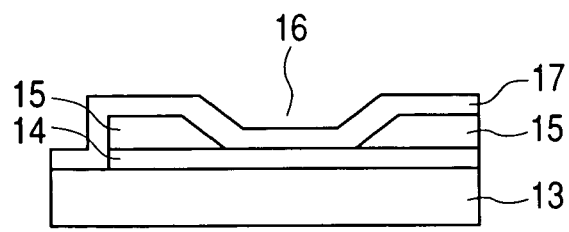
Figure 2E:
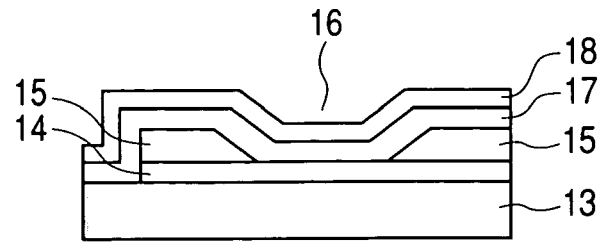

A process flow of a representative producing method for the circuit substrate of the present invention is shown in cross-sectional views in FIGS. 2A to 2E. In the following, embodiments of the present invention will be explained with reference to FIGS. 2A to 2E.

In the present invention, a substrate for forming a circuit can be of any material having an insulating surface, allowing layer lamination by sputtering or the like onto the surface and stable to an ordinary etching process. However, in an ordinary process, in consideration of availability and ease of circuit formation, there is employed an ordinary Si wafer 11 on which a $SiO_2$ oxide layer 13 is formed by an oxidation process. In such case, a thickness of the $SiO_2$ oxide layer is preferably selected as about 200 nm to 1 µm, in consideration of robustness and cost.

As a resistive material layer 14 for forming the resistive layer, there can be employed any material having a resistivity within a range of 60 to 800 Ω·cm and capable of being formed in a layer by sputtering or the like, but TaSiN, CrSiN or the like is advantageously employed in consideration of reliability. TaSiN is particularly preferable in consideration of working property. In the invention, a thickness of the resistive (material) layer is preferably 20 to 100 nm in consideration of the reliability.

An electrode material layer 15 for forming a wiring layer in the invention is constituted of a material containing Al, preferably containing Al as a principal component. In particular, a material containing Cu in a small amount (for example, 0.5 mass %), Al—Si—Cu, Al—Si or Al—Ta is advantageous. The "principal component" means a component contained in a largest proportion in the material.

A film thickness of the wiring layer can be selected within a range of 200 to 1,500 nm, preferably 600 to 1,500 nm in consideration of heat generation. The wiring layer is usually formed by sputtering, but a Cu film can also be formed by plating.

Resist layers (I) and (II) can be formed with any material utilized ordinarily, such as a novolac resin or an acrylic resin, and a novolac resin is advantageous in the present invention.

A protective layer 17 can be advantageously constituted of P—SiN etc., and is preferably formed by plasma CVD. Usually the covering power is extremely deteriorated unless the protective layer has a film thickness larger than that of the wiring layer, but the covering power is not affected in the present invention even when the film thickness is reduced to a certain extent.

An anti-cavitation film 18 is formed on the outside of the protective layer, and is usually constituted of Ta. It is preferably formed by sputtering.

As a wet etching solution, an organic alkali etching solution or an acid etching solution can be advantageously employed. Representative examples include TMAH for the former and phosphoric acid for the latter.

As a feature of the present invention, a chelating agent capable of forming a complex with a wiring metal is added to the etching solution, in order to execute the etching of the wiring metal appropriately. There is preferred an alkaline chelating agent such as BTA or phosphoric amine in case the solution is alkaline, or an acidic chelating agent such as citric acid, oxalic acid or EDTA in case the solution is acidic.

Also in case of employing a phosphoric acid-containing etching solution, because of a high viscosity of such solution, a long rinsing time is required, and even a metal surface with a complex formation on the surface may cause a local Al void by a battery effect as it is exposed to the acidic aqueous solution for a long period.

For preventing such Al void, the phosphoric acid-containing etching solution is replaced by a 20 to 100 ppm aqueous solution of citric acid before rinsing with purified water. Such replacement with the aqueous solution of citric acid maintains the complex on the entire surface of the wiring in stable state, whereby the Al—Cu battery effect is hindered in an ensuing short rinsing time and the Al surface is maintained in a smooth state without causing void.

In the following, the present invention will be explained further by examples thereof.

EXAMPLE 1

FIG. 1 is a flow chart showing a process for producing a circuit substrate in example 1. The process will be explained in the following with reference to cross sectional views in FIGS. 2A to 2E.

At first a Si wafer was employed as a substrate 11, and a $SiO_2$ oxide layer 13 of a thickness of several micrometers was formed by thermal oxidation. On the oxide layer, a resistive material layer 14 of TaSiN was formed by sputtering with a thickness of 50 nm. Then Al, containing Cu by 0.5 mass %, was formed into a film of a thickness of 600 nm to obtain an electrode material layer 15. On the electrode material layer, a resist layer (I) (not shown) was formed and pattern, and the electrode material layer and the resistive material layer were dry etched by RIE to isolate the element, whereby electrodes (wiring layer) patterned in a form including predetermined wiring patterns and a resistive layer were obtained.

Then a resist layer (II) (not shown) is formed and patterned, and the wiring layer was removed by wet etching in a portion where a heat generating portion 16 is to be formed by the resistive layer, thereby forming Al wirings formed by non-etched portions of the wiring layer, and a heat generating element in which a pair of opposed Al wirings, formed by etching, are positioned on the resistive layer as electrodes across the heat generating portion of the resistive layer.

As a wet etching solution, there was employed an organic etching solution containing 500 ppm of BTA in a 5% aqueous solution of TMAH, and etching was executed at a liquid temperature of 40° C.

BTA has an effect of forming a complex with Cu in the Al wiring, thereby providing a barrier to the electron exchange between Cu and the etching solution. Therefore the battery effect between Al and Cu is hindered, and the Al wiring shows a smooth etched shape without causing an Al void. After the etching, rinsing is executed with purified water, but, since BTA complex is formed on Cu, the Al—Cu battery effect is hindered to maintain the surface of the Al wiring in a smooth state.

Then a SiN protective layer 17 of a thickness of about 300 nm was formed by plasma CVD, and a Ta anti-cavitation film 18 was formed by sputtering. Then, after a resist patterning again, an unnecessary portion of the anti-cavitation film was removed by dry etching to obtain a circuit substrate. In thus produced circuit substrate, the protective film and the anti-cavitation film showed satisfactory covering property on the heat generating element.

EXAMPLE 2

Figure 3:
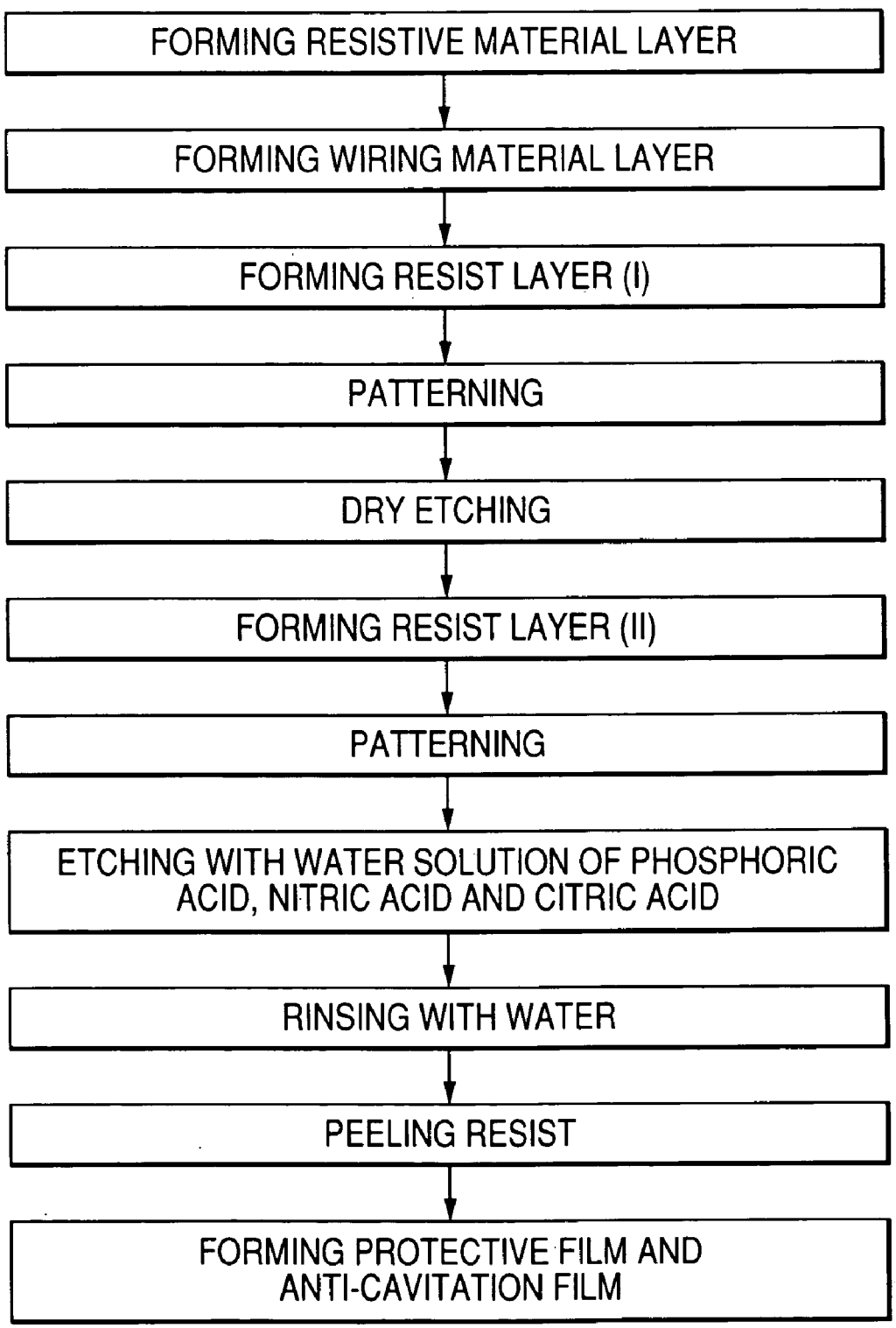
FIG. 3 is a flow chart showing a process for producing a circuit substrate in an example 2 embodying the present invention.

FIG. 3 is a flow chart showing a process for producing a circuit substrate of example 2. Cross-sectional views are shown in FIGS. 2A to 2E as in example 1. At first, as in example 1, on a Si substrate 11, an $SiO_2$ film 13, a resistive material layer 14, and a wiring material layer (Al layer) 15 were formed. On the wiring material layer, a resist layer (I) was formed and patterned, and the wiring material layer and the resistive material layer were dry etched by RIE to isolate the element, thereby forming a wiring layer and a resistive layer.

Then a resist layer (II) was formed and patterned, and the wiring layer was removed by wet etching in a portion where a heat generating portion 16 is to be formed in the resistive layer. As a wet etching solution, there was employed an acidic etching solution formed by adding citric acid within a range of about 100 ppm to 20% to an aqueous solution of phosphoric acid and nitric acid, and the etching was executed at a liquid temperature of 40° C. Citric acid has an effect of forming a complex with each of Al and Cu in the Al wiring, thereby providing a barrier to the electron exchange between Al, Cu and the etching solution. Therefore the battery effect between Al and Cu is hindered, and the Al wiring shows a smooth etched shape without causing an Al void. After the etching, rinsing is executed with purified water, but, since the complex is formed on the entire surface of the wiring, the Al—Cu battery effect is hindered and the Al surface is maintained in a smooth state without void.

Then a first protective layer 17 of SiN of a thickness of about 300 nm was formed by plasma CVD, and a Ta anti-cavitation film 18 was formed by sputtering. Then, after a resist patterning again, an unnecessary portion of the anti-cavitation film was removed by dry etching to obtain a circuit substrate. In thus produced circuit substrate, the protective film and the anti-cavitation film showed satisfactory covering property on the heat generating element.

EXAMPLE 3

Figure 4:
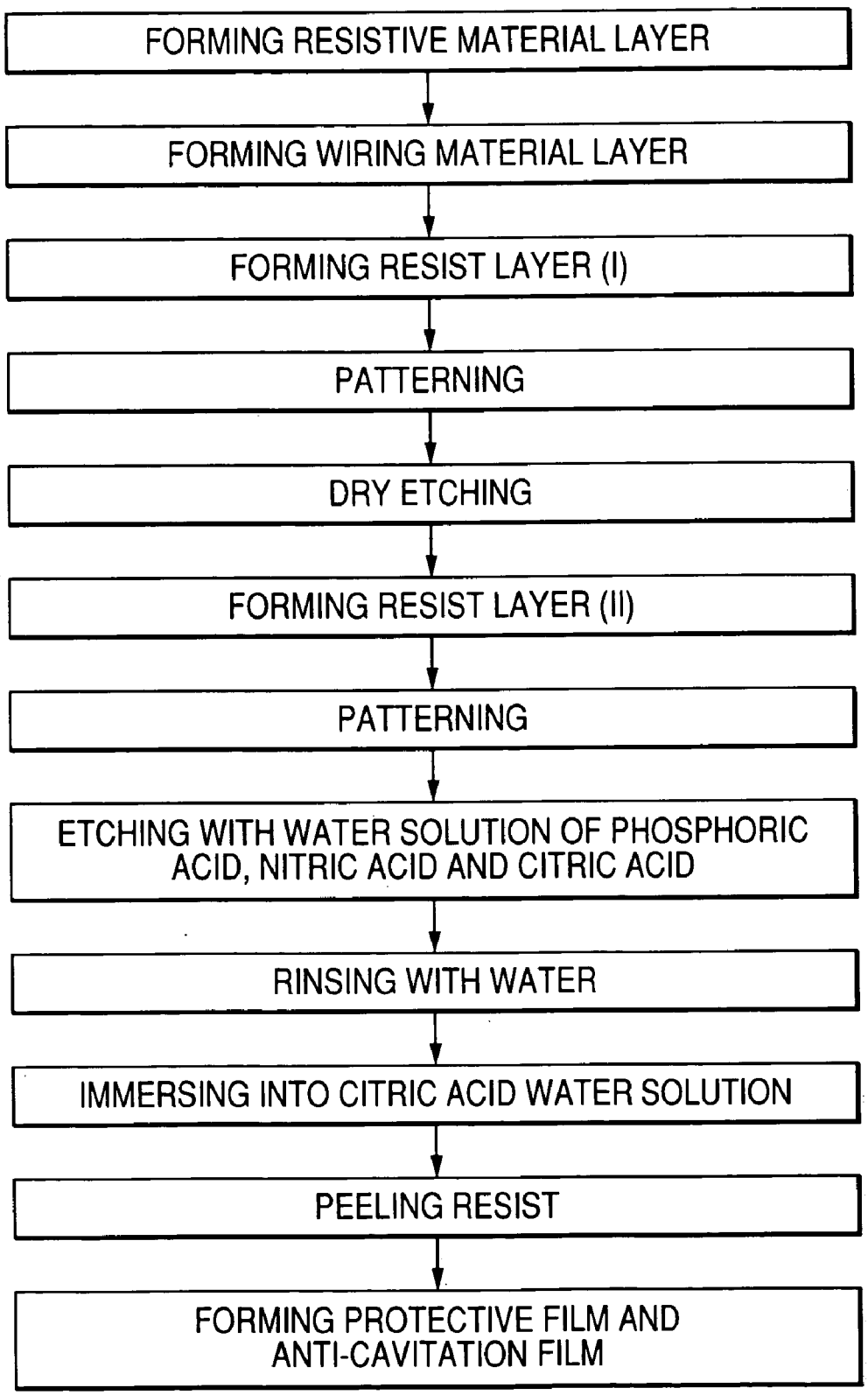
FIG. 4 is a flow chart showing a process for producing a circuit substrate in an example 3 embodying the present invention.

FIG. 4 is a flow chart showing a process for producing a circuit substrate of example 3. Cross-sectional views are shown in FIGS. 2A to 2E as in examples 1 and 2. As in example 1, on a Si substrate 11, an $SiO_2$ film 13, a resistive material layer 14, and a wiring material layer (Al layer) 15 were formed. Then, after a resist patterning, the Al wiring was etched by RIE to pattern the wirings.

Then, forming a heat generating portion 16 in the resistive layer, a resist patterning was executed and the Al layer corresponding to the heat generating portion 16 of the resistive layer was removed by wet etching. As a wet etching solution, there was employed a phosphoric acid-containing etching solution formed by adding citric acid within a range of about 100 ppm to 20% to an aqueous solution of phosphoric acid and nitric acid, and the etching was executed at a liquid temperature of 40° C.

After the etching, there is executed rinsing with purified water, but, because of a high viscosity of the phosphoric acid-containing etching solution, there is required a long time. Therefore, even a metal surface with a complex formation on the surface may cause a local Al void by a battery effect in case it is exposed for a long time to an acidic aqueous solution. In order to prevent such Al void, in the present example, the phosphoric acid-containing etching solution was replaced, before the rinsing with purified water, with an aqueous solution containing citric acid by 20 to 100 ppm. Such replacement with the aqueous solution of citric acid maintains the complex on the entire surface of the wiring in a stable state, whereby the Al—Cu battery effect was hindered in the ensuing short rinsing time and the Al surface was maintained in a smooth state without generating void.

Figure 5A:
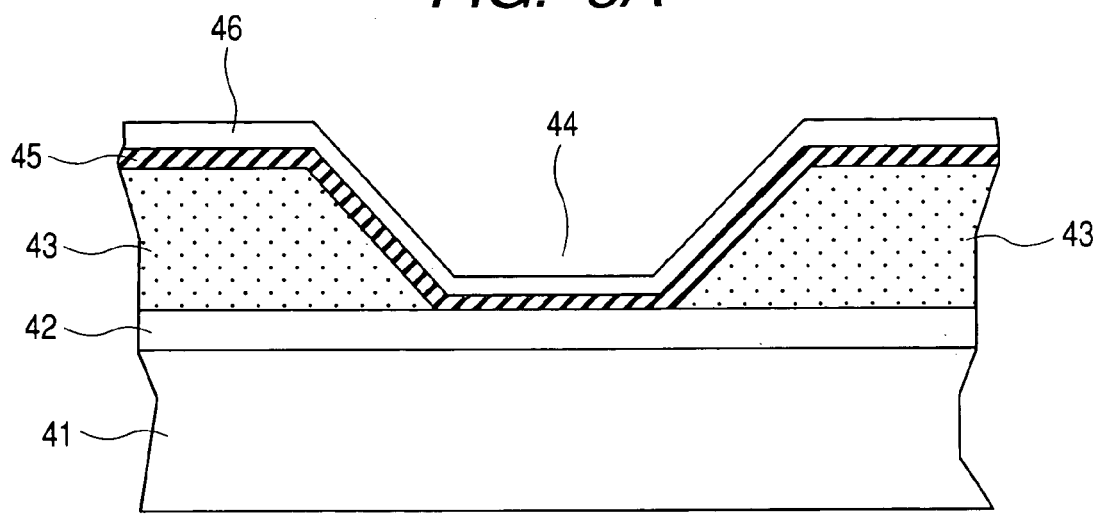

Then a Sin protective layer of a thickness of about 300 nm was formed by plasma CVD, and a Ta film was formed by sputtering. Then, after a resist patterning again, an unnecessary portion of the Ta film was removed by dry etching to obtain a heat generating portion similar to that shown in FIG. 5A.

Comparative Example

Figure 6:
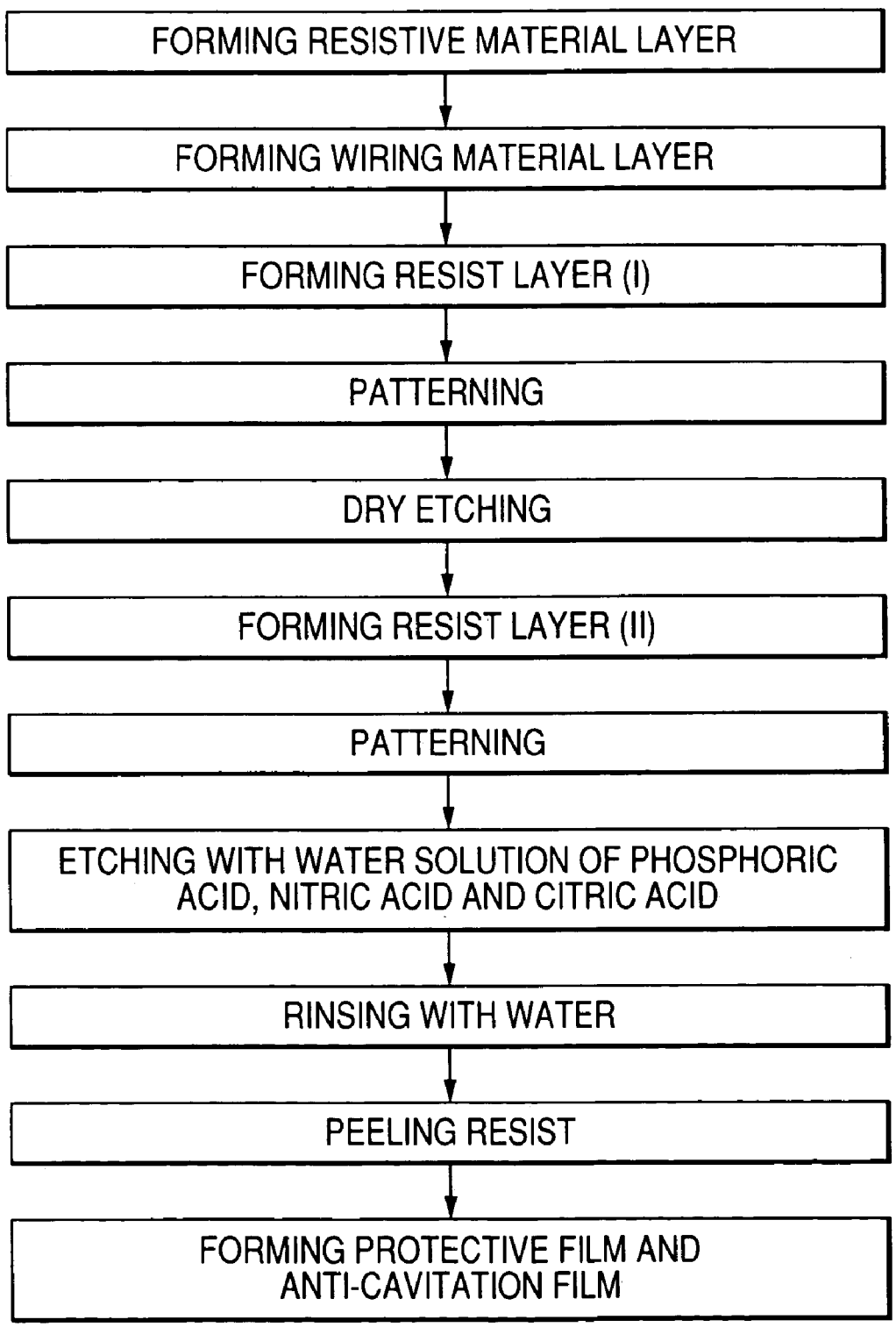
FIG. 6 is a flow chart showing a prior process for producing a circuit substrate.
Figure 7:
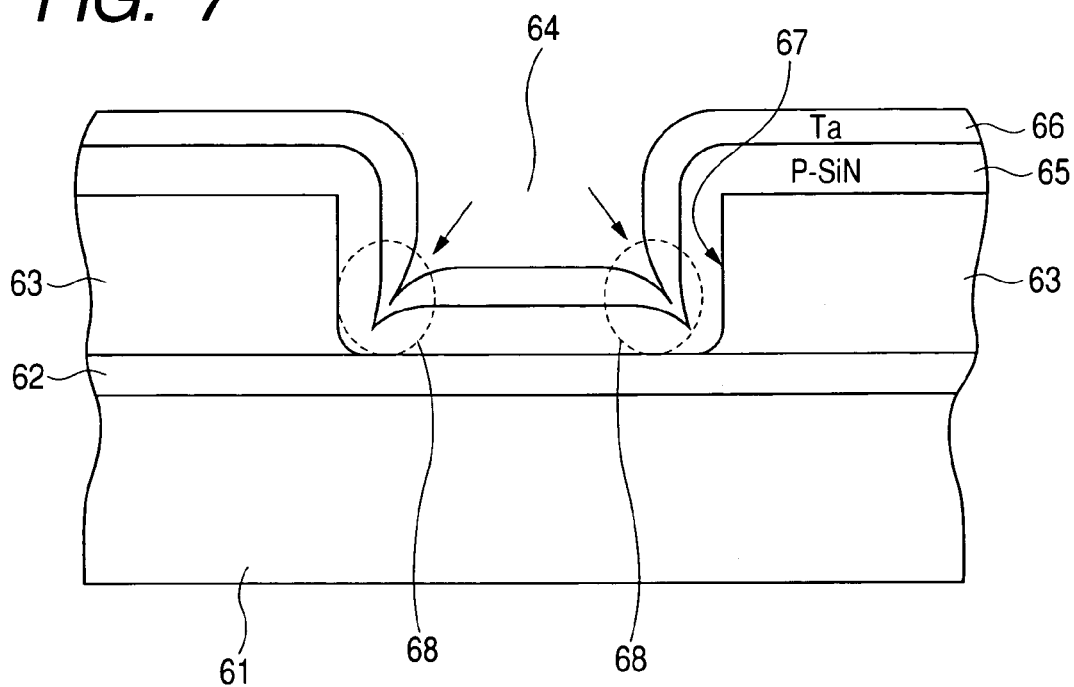
FIG. 7 is a schematic cross-sectional view showing vicinity of a heat generating element in a prior circuit substrate.

As a comparative example to the examples 1 to 3, a circuit substrate was prepared according to a manufacturing process shown in FIG. 6, which shows a prior producing process for the circuit substrate. At first, as in the example 1, an oxide layer, a resistive material layer and a wiring material layer were formed on a Si substrate. On the wiring material layer, a resist layer (I) was formed and patterned, and the wiring material layer and the resistive material layer were dry etched by RIE to form a wiring layer and a resistive layer.

Then a resist layer (II) was formed and patterned, and the wiring layer was removed by wet etching in a portion where a heat generating portion is to be formed in the heat generating element. As a wet etching solution, there was employed an acidic etching solution formed by adding citric acid within a range of about 100 ppm to 20% to an aqueous solution of phosphoric acid and nitric acid, and the etching was executed at a liquid temperature of 40° C. Thereafter rinsing was executed with purified water.

Then a SiN first protective layer of a thickness of about 300 nm was formed by plasma CVD, and a Ta anti-cavitation film was formed by sputtering. Then, after a resist patterning again, an unnecessary portion of the anti-cavitation film was removed by dry etching to obtain a circuit substrate.

Figure 5B:
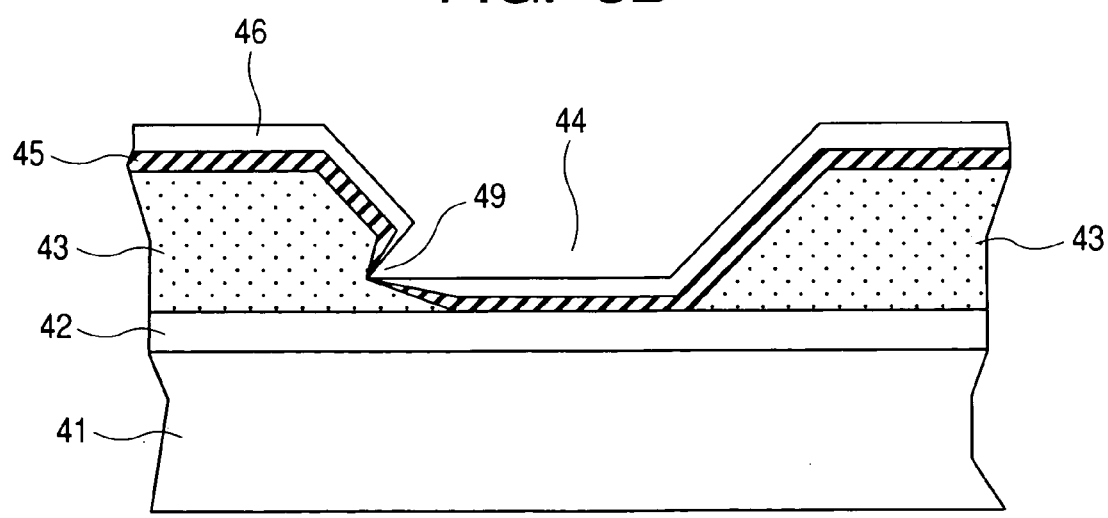

In contrast to citric acid etc., acetic acid does not have an effect of forming a complex, thus not forming a barrier to the electron exchange between Al, Cu and the etching solution. Therefore the battery effect between Al and Cu is not hindered, and the Al wiring showed Al void, with irregularities in the etched form. The Al void formation proceeded also in the rinsing with purified water, resulting in increased irregularities. As a result, in the produced circuit substrate, the covering property of the protective film and the anti-cavitation film on the heat generating element was deteriorated in irregular portion, as shown in FIG. 5B.

Table 1 shows a comparison in ink durability of the comparative example with the examples 1, 2 and 3. The test was conducted by assembling each of the circuit substrates formed in the comparative example and the examples 1, 2 and 3 into a liquid discharge head, executing ink discharges of $1 \times 10^5$ times and investigating a number of breakages in the heat generating resistive members. In each test, the result was calculated against a base number of 100,000.

TABLE 1

|  | Example | | | Comparative |
| --- | --- | --- | --- | --- |
|  | 1 | 2 | 3 | example |
| Number of breakages of resistive members | 80 | 40 | 20 | 250 |

In any of the examples 1, 2 and 3, the print durability was improved in comparison with the prior technology. These examples employed a wiring material of Al containing Cu by 0.5 wt. % with a thickness of the wiring film of 600 nm, but similar results were obtained in any Al-containing material such as Al—Si—Cu, AlSi or AlTa. Also in tests with varied thicknesses of the wiring layer, the aforementioned effect was observed within a range of 200 to 1,500 nm. In particular, the coverage is extremely deteriorated when the thickness of the protective layer becomes smaller than that of the wiring film, but, in the present invention, the coverage is not effected even when the thickness becomes somewhat smaller because of the aforementioned effect. In the present invention, BTA or citric acid is employed as the chelating agent, but a similar effect was observed with an addition of oxalic acid, phosphoric amine or EDTA of 5% or less.

The effect of the present invention is naturally not limited to the foregoing, and, for example, the thickness of the wiring film is not limited to that explained above.

EXAMPLE 4

Furthermore, according to the investigation of the present inventors, it is found that the wet etching at the patterning and the rinsing after the etching induce dissolution of Al by a battery effect caused by a local battery structure of Al and Cu. This example is achieved, based on this finding.

More specifically, it is found that the covering property of the protective layer and the anti-cavitation film on the heat generating element is improved by executing the step of eliminating the resist layer for patterning the resistive material layer and the electrode material layer, for forming the electrodes, at a temperature of 150° C. or less.

Figure 11:
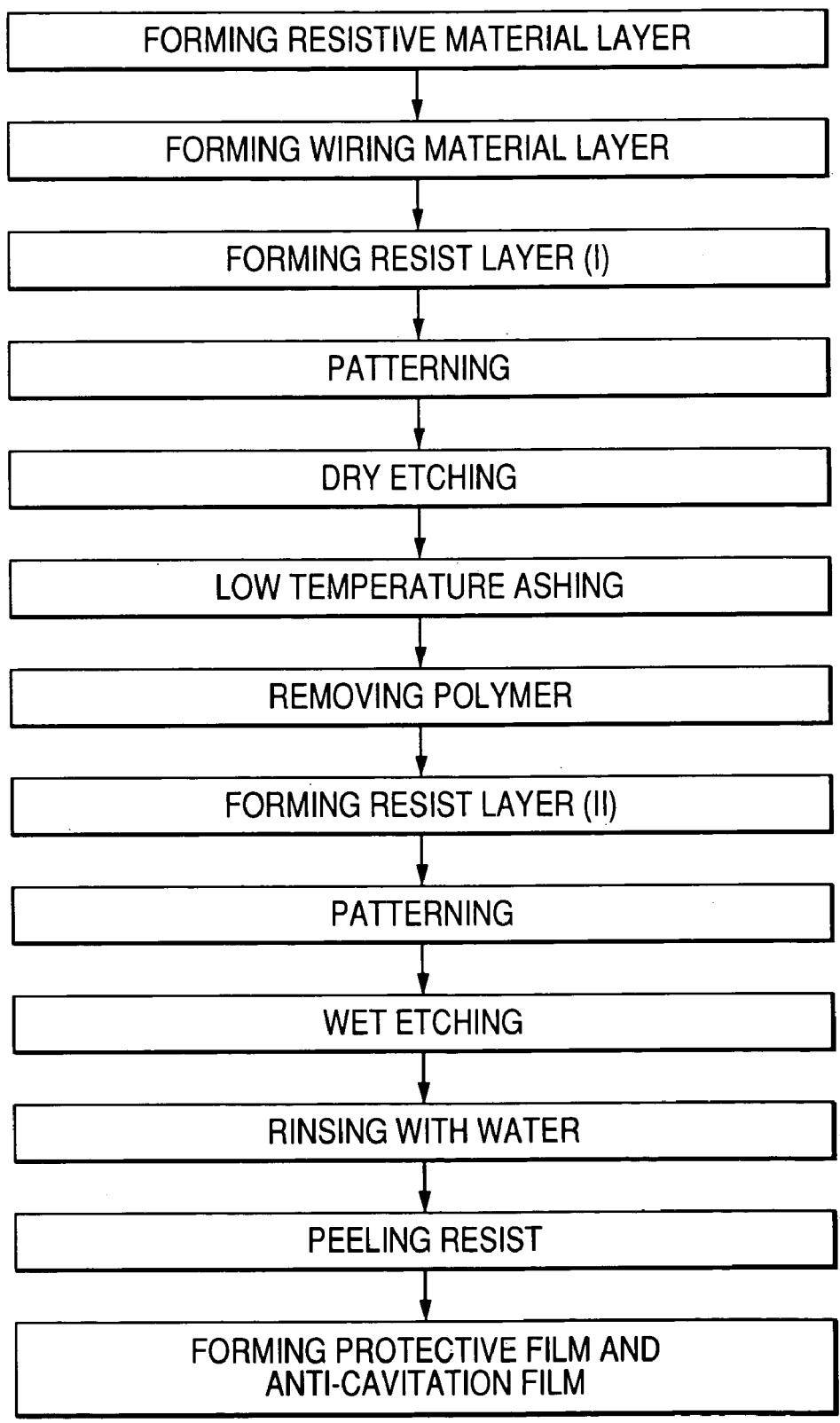
FIG. 11 is a flow chart showing a process for producing a circuit substrate in an embodiment of the present invention.

FIG. 11 is a flow chart showing a process flow for producing the circuit substrate of the present example.

Also FIGS. 12A to 12E are cross-sectional views corresponding to the process flow shown in FIG. 11. In the following there will be explained a method for producing a heat generating resistive element having a heat generating member featuring the present invention. Components similar to those in FIGS. 2A to 2E are represented by same numbers and will not be explained further.

A resistive material layer 14 is deposited on a substrate having an insulating and heat-accumulating surface. There can be employed any material that has a resistivity within a range of 300 to 2,000 μΩ·cm and can be deposited by sputtering or the like, but TaN, TaSiN or the like can be advantageously employed in consideration of productivity. Particularly TaSiN is preferable in that the specific resistivity can be easily increased and in easy availability. In particular, amorphous TaSiN is preferable. In the present invention, the resistive (material) layer preferably has a thickness of 30 to 80 nm in consideration of the durability.

In the following, there will be explained a step (ashing) for eliminating the resist layer, featuring the present example. According to the process shown in FIG. 11, a resist layer (I) is formed and patterned into a desired shape. Then a conductive material for forming the wiring layer and a resistive material are etched according to such pattern, and the resist layer (I) is eliminated by ashing. The ashing is executed for example with $CF_4$—$O_2$-methanol gas, $CF_4$—$O_2$ gas, or a fluorocarbon gas such as $CHF_3$, $C_2F_6$ or $C_4F_8$. In the present embodiment, the ashing process for eliminating the resist is executed at a process temperature of 150° C. or lower.

In the following, the process temperature at the resist ashing process will be explained.

For example, when an Al alloy film containing Cu by 0.5% is formed by sputtering, Cu is dissolved in solid in the Al film immediately after the film formation. However, at the ashing of the resist for patterning the electrode (wiring) 15, if the process is executed at a stage temperature of 200° C. or higher for increasing the reaction speed, Cu becomes mobile in Al, and, because of a slow cooling to the normal temperature after the ashing, Cu cannot be dissolved in Al in solid state. Thus Cu that cannot be dissolved precipitates at the grain boundary of Al. Thus, Al may be dissolved out starting from such precipitated Cu by the local battery effect, at the wet etching for patterning the heat generating resistive element or at the rinsing after the wet etching.

It is thus found out that a resist ashing process at 150° C. or lower capable of preventing Cu precipitation allows to avoid Al dissolution by the local battery effect thereby improving the step coverage of the electrode (wiring) 15, the protective layer and the anti-cavitation film.

Also in the present embodiment, in the wet etching solution for etching after the formation of the resist layer (II) in FIG. 11, it is possible to add a chelating agent capable of forming a complex with the wiring metal into the etching solution, as explained in the examples 1 to 3, in order to execute the etching of the wiring metal appropriately. The chelating agent is preferably added in an amount of several ppm to several percent, and there is preferred an alkaline chelating agent such as BTA or phosphoric amine in case the solution is alkaline, or an acidic chelating agent such as citric acid, oxalic acid or EDTA in case the solution is acidic.

In the following, the producing method of the present example will be explained in more detail.

Figure 12A:
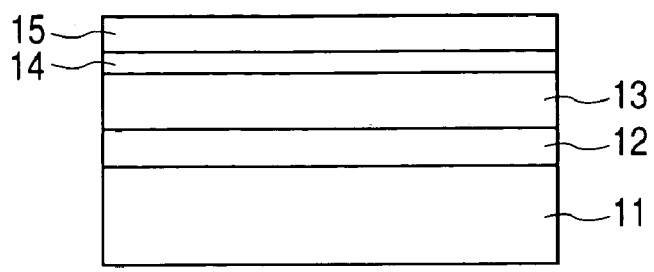
FIGS. 12A, 12B, 12C, 12D, and 12E are cross-sectional views showing a process for producing a circuit substrate in an embodiment of the present invention.

At first, on a Si substrate 11, a BPSG (boro-phospho-silicate-glass) insulating layer 12, and a heat accumulating layer 13 of silicon oxide (P—SiO) by plasma CVD were laminated in succession, and a resistive material layer 14 of amorphous TaSiN was further deposited thereon. Then an electrode material layer 15 of aluminum containing 0.5% of Cu (Al—Cu) was formed by sputtering (FIG. 12A).

Thicknesses were 700 nm for the insulating layer 12, 1,200 nm for the heat accumulating layer 13, 40 nm for the resistive material layer 14 and 600 nm for the eletrode material layer 15.

Figure 12B:
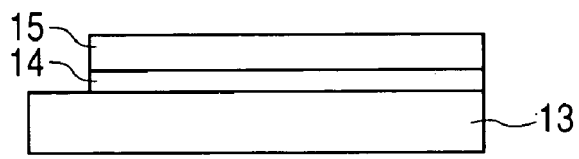

Then a resist layer (I) was formed on the electrode material layer 15 and patterned, and the resistive material layer 14 and the electrode material layer 15 were collectively dry etched by RIE to achieve element isolation, thereby forming wirings (FIG. 12B). Then the resist layer (I) was removed by an ashing process with $CF_4$—$O_2$-methanol gas, executed at a process temperature of 150° C. (Example 4a). Also a same process was executed on different samples of same condition, at different temperatures (example 4b: 100° C., example 4c: 25° C., comparative example 4a: 250° C., and comparative example 4b: 200° C.).

Figure 12C:
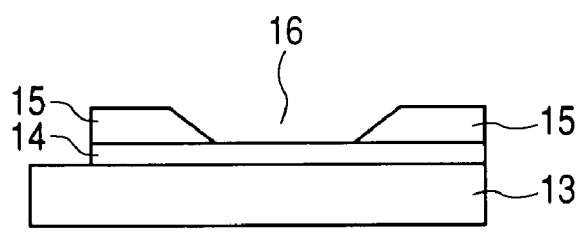
Figure 12D:
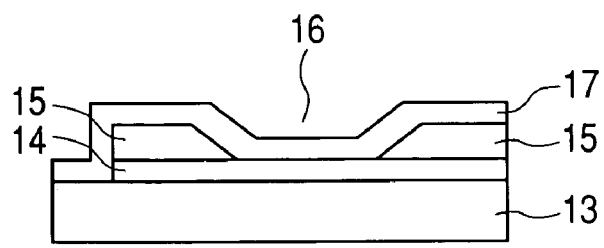
Figure 12E:
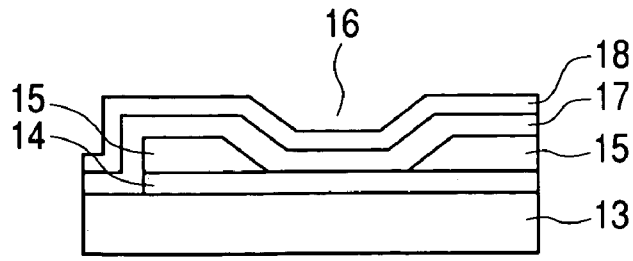

Then, for forming the heat generating portion 16 in the resistive layer, a resist layer (II) was formed and patterned with a mask, and the Al layer was removed by wet etching in a portion corresponding to the heat generating portion 16 of the resistive layer (FIG. 12C). The wet etching solution employed was a mixture of phosphoric acid, nitric acid and acetic acid.

Then a protective layer 17 of silicon nitride (P—SiN) was deposited by plasma CVD (FIG. 12D), with a film thickness of 260 nm.

Then a Ta anti-cavitation layer 18 was deposited on the protective layer 17, so as to cover the heat generating portion 16 of the resistive layer (FIG. 12E), with a film thickness of 230 nm.

The configuration was evaluated in the following manner.

The circuit substrates prepared with the varied resist ashing temperatures were immersed in a BHF (buffered hydrofluoric acid) solution, and evaluation was made by a number of defective cases in which the step coverage of the protective film and the anti-cavitation film was unsatisfactory and resulted in an erosion of the resistive layer or the electrode (wiring). Results of evaluation are shown in table 2 (coverage evaluated as satisfactory for zero defect).

TABLE 2

| Resist ashing temperature (° C.) | Defect rate (%) | Defect number | Total number observed |
|---|---|---|---|
| 250 (Comp. ex. 4a) | 0.61 | 39 | 6,400 |
| 200 (Comp. ex. 4b) | 0.13 | 8 | 6,400 |
| 150 (Example. 4a) | 0.00 | 0 | 6,400 |
| 100 (Example. 4b) | 0.00 | 0 | 6,400 |
| 25 (Example. 4c) | 0.00 | 0 | 6,400 |

As shown in table 2, the coverage property of the protective film and the anti-cavitation film is drastically improved by executing the resist ashing process at the patterning of the wiring, at a process temperature of 150° C. or lower.

The circuit substrate in which the heat generating element having the heat generating resistive member is formed in the aforementioned manner shows a high step coverage and is hardly associated with breakages in a part of the resistive layer 14 by the corrosion by the ink, because of the absence of Al dissolution in the wet etching for forming the heat generating element or in the rinsing after the wet etching, thereby realizing a highly durable recording head. The step coverage property means whether the protective layer etc., covers and protects the resistive layer and the electrode (wiring) with a sufficient thickness. In case the step coverage is poor in an area, it becomes necessary to deposit a thick protective layer over the entire area in order to form a protective layer of a sufficient thickness in such area, whereby the heat conduction efficiency and the heat conduction rate are deteriorated. A satisfactory step coverage uniform over the entire area allows to prepare a highly durable recording head with a high heat conduction efficiency, a low electric power consumption, a high heat conduction rate and capable of a high-speed operation.

Then a protective layer 17 and an anti-cavitation film 18 are deposited in this order and bonding pads are formed by partially eliminating these films in necessary portions, whereby a substrate for an ink jet recording head is completed.

A liquid discharge head can be prepared by forming discharge ports on thus prepared circuit substrate. More specifically, a discharge portion including discharge ports and ink flow paths is formed by providing nozzle walls and a top plate on the circuit substrate.

(Liquid Discharge Apparatus)

A liquid discharge head, according to each embodiment of the present invention, can be prepared by forming a heat generating resistive member including a resistive layer on the insulating layer of a semiconductor apparatus in each aforementioned embodiment, and combining thereto a discharge port forming member such as a top plate constituted of a molded resin or a film, thereby forming discharge ports and liquid paths communicating therewith. It functions as an ink jet printer by connecting a container, mounting such head on a main body of a printer and supplying a power supply voltage from a power supply circuit of the main body and image data from an image processing circuit.

Figure 8:
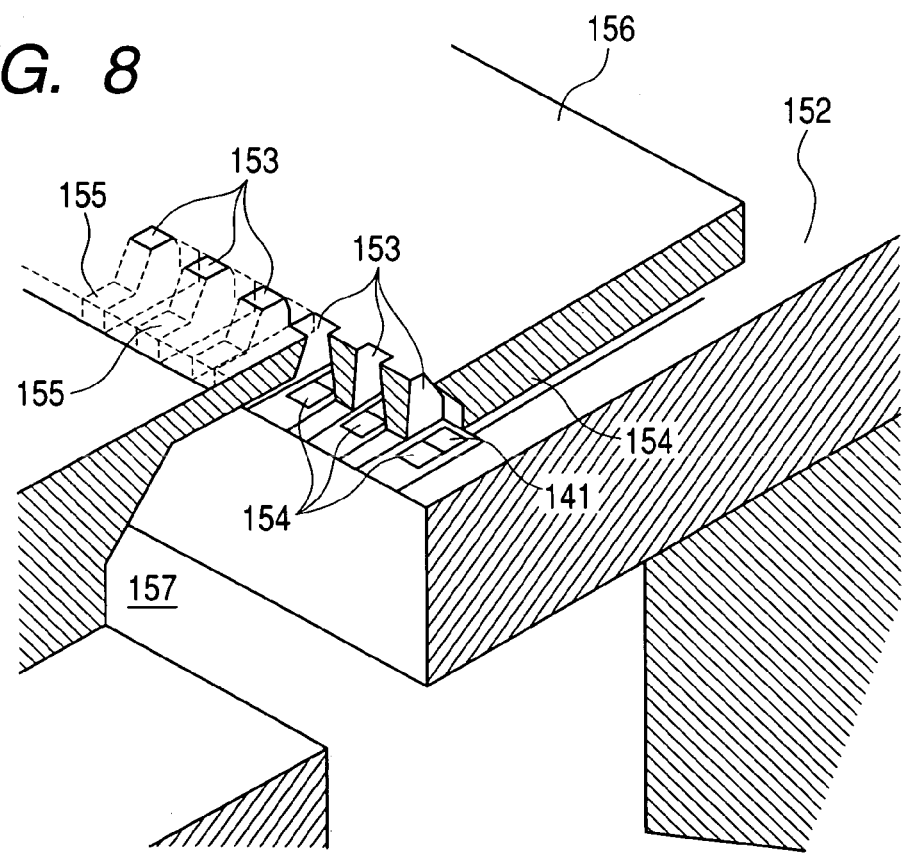
FIG. 8 is a partial view of a liquid discharge head utilizing a circuit substrate of the present invention.

FIG. 8 is a view showing an embodiment of the liquid discharge head employing the circuit substrate in an embodiment of the present invention, and illustrates a part of the liquid discharge head.

On an element substrate 152 bearing a circuit prepared according to the present invention, an electrothermal converting element 141, for generating heat in response to an electrical signal and discharging ink from a discharge port 153 by a bubble generated by such heat, is provided in plural units, arranged in an array. Each electrothermal converting element 141 is provided with wiring electrodes 154 for supplying an electrical signal for driving the electrothermal converting element, and one of the wiring electrodes is electrically connected to an unillustrated switching element.

A flow path 155 for ink supply to a discharge port 153, provided in a position opposed to the electrothermal converting element 141, is formed corresponding to each discharge port 153, and a grooved member 156, having walls for defining the discharge port 153 and the flow path 155, is connected to the element substrate 152 thereby defining the flow path 155 and a common liquid chamber 157 for ink supply to plural flow paths.

Figure 9:
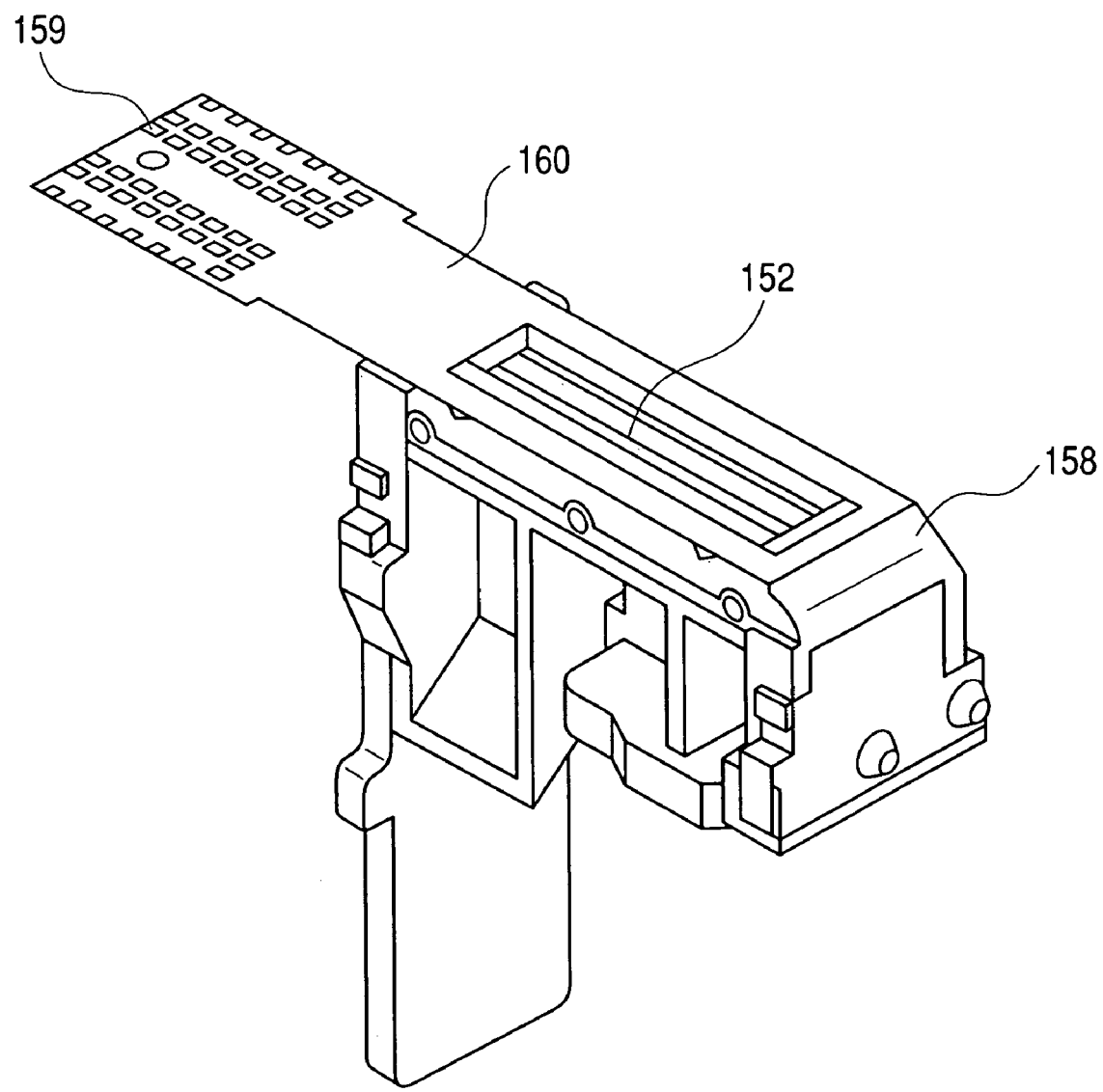
FIG. 9 is a view showing a structure of a liquid discharge head incorporating a heat generating element having a heat generating resistive member of the present invention.

FIG. 9 shows the structure of a liquid discharge head incorporating the element substrate 152 bearing the heat generating resistive member of the present invention, and the element substrate 152 is incorporated in a frame 158. On the element substrate, there is assembled a member 156 constituting the discharge port 153 and the flow path 155 as explained above. A contact pad 159 is provided for receiving an electrical signal from the apparatus, and various electrical drive signals are supplied from a controller of the main body of the apparatus to the element substrate 152 through a flexible printed circuit board 160.

Figure 10:
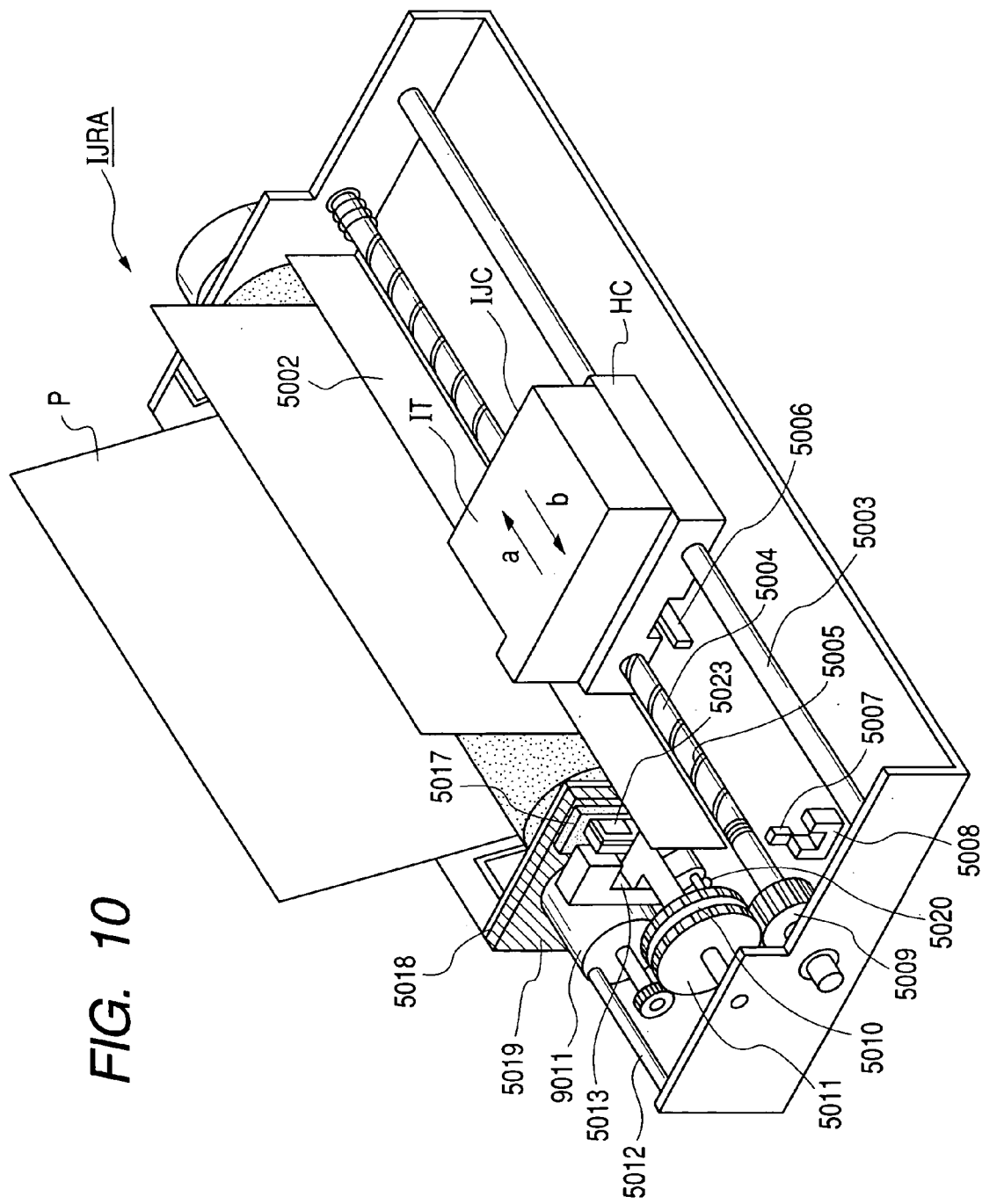
FIG. 10 is a view showing an embodiment of a liquid discharge apparatus in which a liquid discharge head utilizing the circuit substrate of the present invention is applied.

FIG. 10 shows an embodiment of the liquid discharge apparatus in which the liquid discharge head utilizing the circuit substrate of the invention is applicable, and gives a schematic view of an ink jet recording apparatus IJRA.

A carriage HC, engaging with a spiral groove 5004 of a lead screw 5005 rotated by forward or reverse rotation of a drive motor 5013 through transmission gears 5011 and 5009, is provided with a pin (not shown) and is reciprocated in directions a and b.

A sheet pressing plate 5002 presses a sheet to a platen 5000, constituting recording medium conveying means, along the moving direction of the carriage. Photocouplers 5007, 5008 constitute home position detection means for confirming the presence of a lever 5006 of the carriage in the area of the photocouplers and switching the rotating direction of the motor 5013. A member 5016 supports a cap member 5022 for capping a front face of the recording head, and suction recovery means 5015 sucks the interior of the cap through a cap aperture 5023 thereby executing suction recovery of the recording head. A cleaning blade 5017 and a member 5019 for retractably supporting the cleaning blade are supported on a supporting plate 5018 of the main body. The blade is not limited to the illustrated form but any cleaning blade known in the art is naturally applicable. A lever 5012 for initiating the suction operation of the suction recovery is actuated by a displacement of a cam 5020 engaging with the carriage, whereby the driving power from the drive motor is transmission controlled by known transmission control means such as a clutch.

Such capping, cleaning and suction recovery are executed at respectively corresponding positions by the function of the lead screw 5005 when the carriage is brought to the home position side, but any configuration for executing the desired operation at a known timing may be applied to the present invention. The aforementioned configurations are excellent inventions either singly or in combination and constitute preferred examples for the present invention.

The present apparatus is further provided with drive signal supply means (not shown) constituted of electrical circuits for supplying the element substrate 152 with a power supply voltage, an image signal and drive control signals.

The present invention is not limited to the foregoing embodiments but the components of the invention may be replaced by alternatives or equivalents as long as the aforementioned objects can be attained.

This application claims priority from Japanese Patent Applications No. 2003-286576 filed on Aug. 5, 2003 and No. 2003-313871 filed on Sep. 5, 2003, which are hereby incorporated by reference herein.

What is claimed is:

1. A method for producing a circuit substrate provided, on an insulating surface of a substrate, with a plurality of elements each including a resistive layer and electrodes constituted of a conductive material containing aluminum and positioned with a predetermined spacing on said resistive layer, the method comprising:
   (a) a step of laminating, on the insulating surface of the substrate, a resistive material layer for forming the resistive layer, and an electrode material layer constituted of a conductive material containing aluminum for forming the electrodes, in succession in this order;
   (b) a step of forming, on the electrode material layer, a resist layer (I) having a pattern for isolating said resistive material layer and said electrode material layer into each element;
   (c) a step of patterning the resistive material layer and the electrode material layer by dry etching based on the pattern of said resist layer (I) thereby forming a laminate structure in which the electrode material layer is laminated on the resistive material layer;
   (d) a step of eliminating the resist layer (I) on said laminate structure;
   (e) a step of forming a resist layer (II) having a pattern for forming the spacing; and
   (f) a step of patterning the electrode material layer by wet etching with an etching solution containing an acid or an organic alkali having an etching ability and a chelating agent capable of forming a complex with the conductive material, based on the pattern of said resist layer (II), thereby forming the spacing to complete the element.

2. The method according to claim 1, wherein the electrode material layer is constituted of a material containing aluminum as a principal component.

3. The method according to claim 1, wherein copper is added to the electrode material layer.

4. The method according to claim 2, wherein the chelating agent added to the etching solution is a chelating agent capable of forming a complex on a surface of the electrode material layer.

5. The method according to claim 4, wherein the etching solution contains an organic alkali as a principal component, and the chelating agent is benzotriazle or phosphoric amine.

6. The method according to claim 4, wherein the etching solution contains an acid as a principal component, and the chelating agent is at least one selected from citric acid, oxalic acid and ethylenediaminetetraacetic acid (EDTA).

7. The method according to claim 6, wherein the chelating agent is citric acid, and further comprising a step (h) of immersing in an aqueous solution of citric acid, after the wet etching step (f) and before a water rinsing step (g).

8. The method according to claim 1, further comprising a step of eliminating an unnecessary portion by ashing immediately after the dry etching.

9. A method for producing a circuit substrate provided, on an insulating surface of a substrate, with a plurality of elements each including a resistive layer and electrodes provided so as to be conductive with said resistive layer, wherein said resistive layer and said electrodes are covered by a protective layer, the method comprising:
   (a) a step of laminating, on the surface of the substrate, a resistive material layer for forming the resistive layer, and an electrode material layer for forming the electrodes, in succession in this order;
   (b) a step of forming, on the electrode material layer, a resist layer (I) having a pattern for isolating said resistive material layer and said electrode material layer into each element;
   (c) a step of forming a laminate structure in which the electrode material layer is laminated on the resistive material layer;
   (d) a step of eliminating the resist layer (I) on said laminate structure;
   (e) a step of forming a resist layer (II) having a pattern for eliminating the electrode material layer in a portion where the resistive layer is to be exposed;
   (f) a step of executing wet etching based on the pattern of said resist layer (II) thereby forming a heat generating portion of the resistive layer and the electrodes;
   wherein the step (d) is executed at 150° C. or lower.

10. The method according to claim 9, wherein the electrodes contain Al and Cu.

11. The method according to claim 9, wherein the electrodes are formed by dry etching.

12. The method according to claim 11, further comprising a step of eliminating an unnecessary portion by a resist ashing immediately after the dry etching.

* * * * *

UNITED STATES PATENT AND TRADEMARK OFFICE
CERTIFICATE OF CORRECTION

| | | |
|---|---|---|
| PATENT NO. | : 7,244,370 B2 | |
| APPLICATION NO. | : 10/910271 | |
| DATED | : July 17, 2007 | |
| INVENTOR(S) | : Keiichi Sasaki et al. | |

It is certified that error appears in the above-identified patent and that said Letters Patent is hereby corrected as shown below:

COLUMN 2:

Line 56, "substae" should read --substrate--.

COLUMN 3:

Line 9, "an." should read --an--.

COLUMN 6:

Line 1, "stable" should read --a stable--;
    Line 11, "cross sectional" should read --cross-sectional--; and
    Line 21, "pattern," should read --patterned,--.

COLUMN 7:

Line 61, "Sin" should read --SiN--.

COLUMN 8:

Line 37, "irregular" should read --an irregular--.

COLUMN 9:

Line 36, "in easy availability." should read --easily available.--.

COLUMN 10:

Line 2, "allows to" should read --can--;
    Line 3, "avoid" should read --prevent--; and
    Line 30, "eletrode" should read --electrode--.

COLUMN 11:

Line 32, "to prepare" should read --preparation of--.

UNITED STATES PATENT AND TRADEMARK OFFICE
CERTIFICATE OF CORRECTION

PATENT NO. : 7,244,370 B2
APPLICATION NO. : 10/910271
DATED : July 17, 2007
INVENTOR(S) : Keiichi Sasaki et al.

It is certified that error appears in the above-identified patent and that said Letters Patent is hereby corrected as shown below:

<u>COLUMN 14</u>:

Line 3, "benzotriazle" should read --benzotriazole--;
Line 36, "exposed;" should read --exposed; and--; and
Line 39, "electrodes;" should read --electrodes,--.

Signed and Sealed this

Fifteenth Day of April, 2008

JON W. DUDAS
*Director of the United States Patent and Trademark Office*